United States Patent
Schnell

(10) Patent No.: US 6,947,303 B2
(45) Date of Patent: Sep. 20, 2005

(54) MEMORY CHIP, MEMORY COMPONENT AND CORRESPONDING MEMORY MODULE AND METHOD

(75) Inventor: Martin Schnell, Munich (DE)

(73) Assignee: Infineon Technologies AG, München (DE)

( * ) Notice: Subject to any disclaimer, the term of this patent is extended or adjusted under 35 U.S.C. 154(b) by 238 days.

(21) Appl. No.: 10/314,797

(22) Filed: Dec. 9, 2002

(65) Prior Publication Data

US 2003/0185082 A1 Oct. 2, 2003

(30) Foreign Application Priority Data

Mar. 28, 2002 (DE) .......................................... 102 14 125

(51) Int. Cl.$^7$ ................................................ G11C 5/02
(52) U.S. Cl. ........................ 365/52; 365/63; 365/225.7
(58) Field of Search .................... 365/225.7, 230.03, 365/230.06, 52, 63, 51

(56) References Cited

U.S. PATENT DOCUMENTS

| | | | |
|---|---|---|---|
| 5,831,890 A | * | 11/1998 | Selna et al. .................... 365/51 |
| 5,995,405 A | | 11/1999 | Trick ............................ 365/63 |
| 6,243,282 B1 | * | 6/2001 | Rondeau, II et al. |
| 6,519,172 B2 | * | 2/2003 | Rondeau, II et al. |
| 6,661,704 B2 | * | 12/2003 | Eaton, Jr. .................... 365/175 |
| 6,744,691 B2 | * | 6/2004 | Tsujino .................. 365/230.03 |
| 6,771,526 B2 | * | 8/2004 | LaBerge |

FOREIGN PATENT DOCUMENTS

DE 10032 256 A1 1/2002

OTHER PUBLICATIONS

German Office Action dated Sep. 4, 2002.

* cited by examiner

*Primary Examiner*—Anh Phung
*Assistant Examiner*—Hien Nguyen
(74) *Attorney, Agent, or Firm*—Jenkins, Wilson & Taylor, P.A.

(57) ABSTRACT

The present invention creates a memory chip, a memory component and a corresponding memory module. The memory chip is equipped with a multiplicity of memory cells and has an an [sic] array (20) of fuses and anti-fuses respectively, which can be written to and read individually in order to store specification information.

5 Claims, 2 Drawing Sheets

MEMORY CHIP, MEMORY COMPONENT AND CORRESPONDING MEMORY MODULE AND METHOD

TECHNICAL FIELD

The present invention relates to a memory chip, a memory component and a corresponding memory module and method.

BACKGROUND ART

Here, memory component is intended to mean one or more memory chips packaged in a single package (e.g. TSOP package), and a memory module is intended to mean one or more memory components mounted on a printed circuit board.

Although applicable to any integrated circuits in principle, the present invention and the problems on which it is based are explained with reference to integrated memory chips in silicon technology.

FIG. 4 shows a schematic representation of a known memory module having a multiplicity of memory components, each containing a memory chip in silicon technology.

In FIG. 4, SC refers to a circuit board, on which, in order to form a memory module SM, a multiplicity of packaged memory chips, or rather memory components SB, are mounted and wired up to contacts SK to form a memory module SM.

According to usual standards, such memory modules SM, which are used for typical computers for example, must be able to output information on the specification so that they can be addressed correctly by the chipset of the computer concerned. This specification includes, for example, the type, the size, the manufacturer, details of clock speeds, serial number etc. The specification information must be stored in the memory module SM in a suitable way in non-volatile form, i.e. so it cannot be modified by the user.

For this purpose, the memory module SM consists of the actual memory chips SB, in SDRAMs (synchronous dynamic random access memory), and of what is known as a serial presence detect component SPD, namely an EPROM memory (electrically programmable read-only memory), in which the specification information of the memory module SM is stored in non-volatile form.

The EPROM memory SPD is connected to a special connection contact SP via a special data line SL. The specification information stored in the EPROM memory SPD can be read serially via this data line SL and the connection contact SP.

Furthermore, it is generally known to replace faulty storage capacitors in such memory chips SB with redundant storage capacitors using fuses or anti-fuses, as they are known.

SUMMARY OF THE INVENTION

It is the object of the present invention to create a memory chip, a memory component and a corresponding memory module and method, in which the storage and reading of the specification information are simplified.

This object is achieved according to the invention by the memory chip according to claim 1, the memory component according to claim 5 and the memory module according to claim 7, and also the method according to claim 11.

The idea on which the present invention is based consists in using what are known as fuses or anti-fuses to integrate in the memory chip the non-volatile memory for storing the specification information in the memory chips, so that said memory chip can be written to once, and subsequently only read. A single fuse or anti-fuse is used for the information in one bit. For example, a fuse that is not blown, having a high electrical resistance, can represent a logic 1, and a blown fuse, having a low resistance, can represent a logic 0.

The storing of the specification information is limited here to blowing or non-blowing of the fuse array for the purpose of bit-wise information storage.

The object according to the invention brings with it a simplified and lower-cost design of the memory module, since the EPROM memory previously required becomes superfluous. This results in higher reliability and a lower risk of producing faulty modules caused by poor solder joints.

Advantageous developments and improvements of the given object of the invention appear in the subclaims.

According to a preferred development, the fuses or anti-fuses can be written to irreversibly.

According to a further preferred development, the array can be written to and read serially, a connection being provided for serial input and output of the specification information.

According to a further preferred-development, the array can be written to and read serially, it being possible to set up a test mode for serial input and output of the specification information via the data lines of the memory cells.

BRIEF DESCRIPTION OF THE DRAWINGS

Exemplary embodiments of the invention are shown in the drawings and explained in more detail in the following description, in which.

DETAILED DESCRIPTION OF THE INVENTION

In the figures, the same references refer to identical or functionally identical elements.

Figure 1:
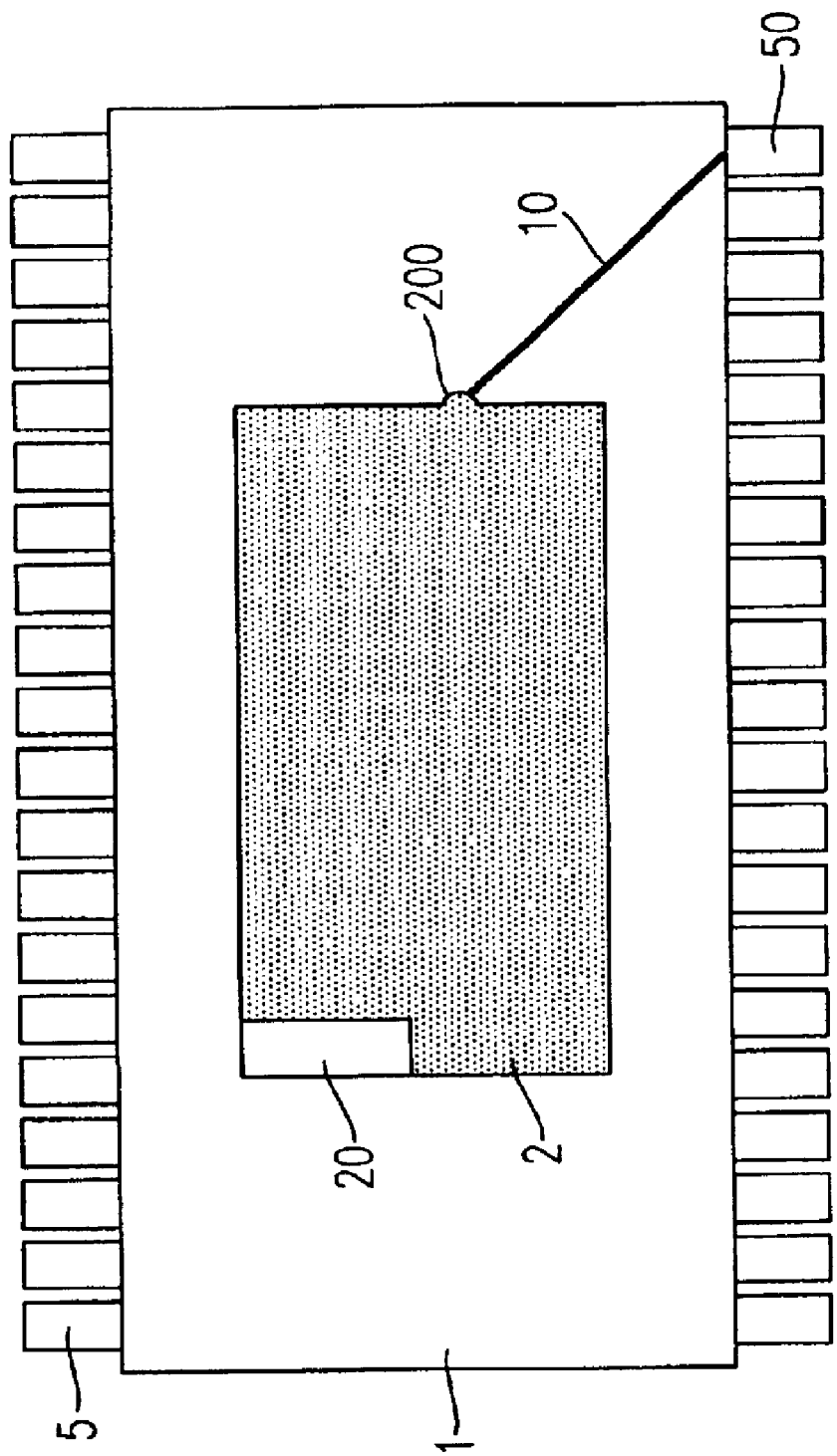
FIG. 1 shows a schematic representation of a memory component in silicon technology as first embodiment of the present invention.

FIG. 1 shows a schematic representation of a memory component in silicon technology as first embodiment of the present invention.

In FIG. 1, reference 1 refers to a memory component having a TSOP package, which component contains a memory chip 2 that is connected to connections 5 of the memory component 1 via circuitry that is not shown, e.g. via a leadframe. The memory chip 2 contains a multiplicity of memory cells, for example SDRAM memory cells, plus an area or an array 20 having a multiplicity of fuses, which can be written to and read individually in order to store specification information.

In particular, the memory chip 2 has a connection 200 for serial reading of the array 20, from which a data line 10 is taken to a connection pin 50. This data line is a serial, internal data line, via which, in a specific test mode, the specification information stored in the fuse array 20 can be read or written via the connection pin 50.

In the first embodiment, the data signal is applied to a connection pin 50 that is unused at the time, so that the reading process can remain compatible with the currently accepted module specification.

Figure 2:
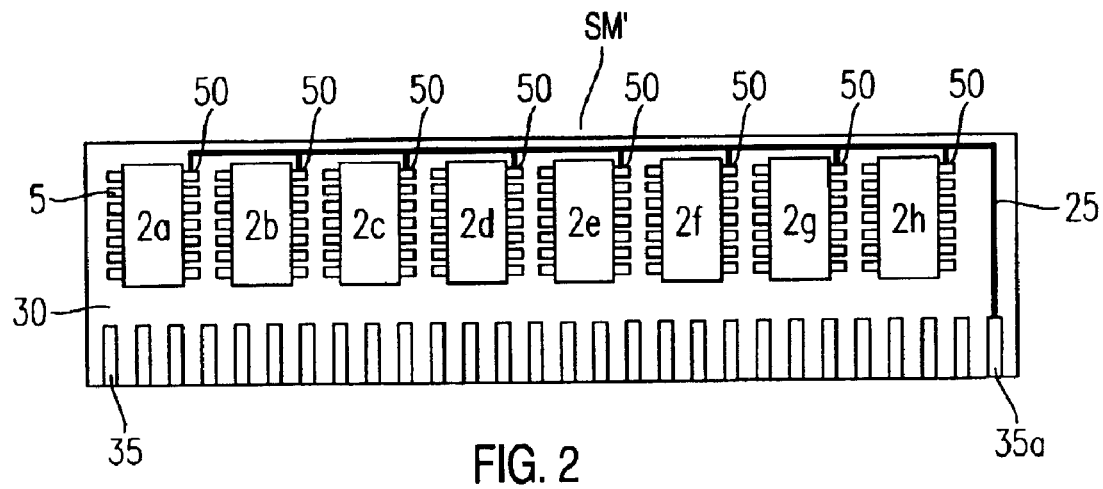
FIG. 2 shows a schematic representation of a memory module having a multiplicity of memory components as second embodiment of the present invention.

FIG. 2 shows a schematic representation of a memory module having a multiplicity of memory components as second embodiment of the present invention.

In FIG. 2, reference SM' refers to a memory module having a multiplicity of memory components 2a to 2h, which are mounted on a printed circuit board 30 having circuitry that is not shown. The printed circuit board 30 has contacts 35, which are connected to the connection pins 5 of the memory components via the circuitry that is not shown. A specially reserved contact 35A is connected to the connection pin 50 of the memory chips 2a to 2h via a data bus 25, so that the specification information from all the memory components 2a to 2h can be taken to the contact 35A via the data bus, and thus can be read externally by a computer in which the memory module is installed.

Figure 3:
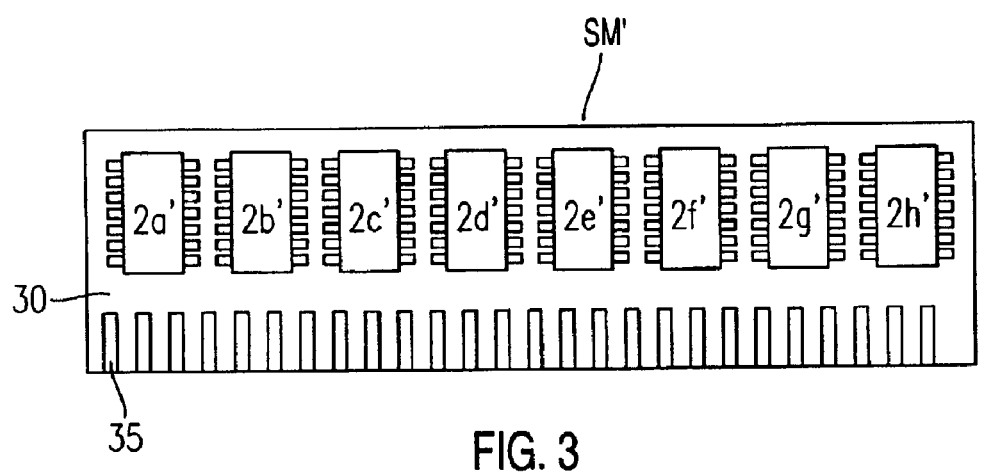
FIG. 3 shows a schematic representation of a memory module having a multiplicity of memory components as third embodiment of the present invention.
Figure 4:
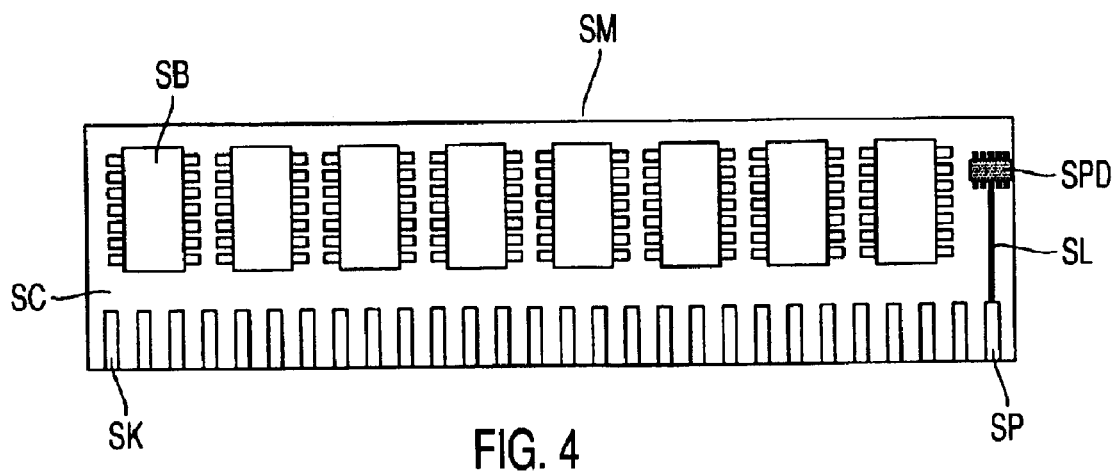
FIG. 4 shows a schematic representation of a known memory module having a multiplicity of memory components, each containing a memory chip in silicon technology.

FIG. 3 shows a schematic representation of a memory module having a multiplicity of memory components as third embodiment of the present invention.

In the memory module SM' shown in FIG. 3, no connection pin 50 is provided on the memory components 2a' to 2h', and thus the additional contact 35A on the printed circuit board 30 is also omitted. In this second embodiment, the specification information from the fuse array 20 can be read or programmed via appropriate addressing of the normal address lines of the memory cells in a given special test mode. This reduces the number of contacts on the printed circuit board.

Hence in the second embodiment, after starting up the memory module, the reading process can be initiated by a special test mode, or the writing process can be initiated by another special test mode, whereupon the specification information is output via the normal connection pin 5 for data. This has the advantage that then extra pins are no longer needed for the fuse array, although in this case the IEEE and JEDEC specification for the module design must be adapted or modified.

It should be noted that the fuse array 20 can be provided in each of the memory components 2a to 2h or 2a' to 2h' respectively, and either all of the specification information can be stored in redundant form in each fuse array 20 or the specification information can be distributed over the memory components.

As a rule, the specification information is stored after the memory module SM' has been assembled, where the raised voltage required for blowing the fuses (e.g. 5 volts write voltage instead of 2.5 volts operating voltage) can either be generated on the memory chip 2, or else can be provided externally by a test system.

A special access code for the memory chip 2 protects the writing to the fuse array 20 from accidental or intentional activation by the user. Once the fuses according to the embodiments above have been blown or fused, then this is an irreversible condition, so that it is subsequently only possible to read the information from the fuse array 20.

Although the present invention has been described above with reference to a preferred exemplary embodiment, it is not limited to this, but can be modified in many different ways.

In particular, the explanation in the context of integrated memory circuits in silicon technology is only by way of example.

Although in the embodiments above, a fuse array was provided for storing the specification information, obviously it is also possible to provide an anti-fuse array instead of this, or a mixed fuse/anti-fuse array, which stores the information in complementary form.

What is claimed is:

1. Memory component having one or more memory chips, the memory chip comprising a plurality of memory cells including an array of fuses or anti-fuses, which can be written to and read individually in order to store specific information, wherein the memory component includes a package having a plurality of connection pins, of which one connection pin is connected to the connection for serial input and output of the specific information.

2. Memory module having a multiplicity of memory components, according to claim 1, which are mounted on a printed circuit board having a multiplicity of contacts.

3. Memory module according to claim 2, wherein the specification information is distributed over different memory chips.

4. Memory module according to claim 2, wherein the specification information exists in redundant form on all the memory chips.

5. Memory module according to claim 2, wherein a data bus is provided on the printed circuit board, which connects all the connection pins of the memory components to a single contact.

* * * * *